Patented May 22, 1951

2,553,797

UNITED STATES PATENT OFFICE 2,553,797

PRODUCTION OF UNSATURATED ORGANIC COMPOUNDS

Ralph B. Thompson, Riverside, Ill., assignor to Universal Oil Products Company, Chicago, Ill., a corporation of Delaware No Drawing. Application July 29, 1947, Serial No. 764,565

11 Claims. (Cl. 260—590)

This invention relates to a process for producing unsaturated organic compounds and organic disulfides, particularly alkyl disulfides.

An object of this invention is the production of an unsaturated organic compound and an organic disulfide.

Another object of this invention is the production of a monoolefin and an alkyl disulfide.

A further object of this invention is the production of an alpha, beta-unsaturated carbonyl compound.

A still further object of this invention is the production of a cycloolefin and an alkyl disulfide.

One specific embodiment of this invention relates to a process for producing an unsaturated organic compound and an organic disulfide which comprises reacting an alkaline mercaptide and an organic compound having two vicinal halogen atoms.

Another embodiment of this invention relates to a process for producing an unsaturated organic compound and an organic disulfide which comprises reacting an organic compound having two vicinal halogen atoms with an alkaline mercaptide which is soluble in at least one member of the group consisting of water and an alcohol.

A further embodiment of this invention relates to a process for producing an unsaturated organic compound and an organic disulfide which comprises reacting a mercaptide of an alkali metal with an organic compound having a middle halogen combined with each of two adjacent carbon atoms.

Still another embodiment of this invention relates to a process for producing an unsaturated organic compound and an organic disulfide which comprises reacting a mercaptide of an alkali metal with an organic compound having a chlorine atom combined with each of two adjacent carbon atoms.

This invention relates to a new method of introducing a double bond into an organic compound which comprises reacting an alkaline mercaptide with an organic compound containing two vicinal halogen atoms, i. e., each of these halogen atoms is combined with adjacent carbon atoms of the halogenated organic compound. In this process, the halogen atoms are removed to form an olefinic double bond and at the same time the alkaline mercaptide is converted into an organic disulfide. In this way the removal of two halogen atoms from an alpha, beta-dihalocarbonyl compound may be achieved by reaction of the dihalo compound with two molecular proportions of an alkali mercaptide to form an alpha, beta-unsaturated carbonyl compound. The alkali mercaptide is also oxidized to a disulfide. This reaction is illustrated by the following equation:

$$C_6H_5\underset{\displaystyle Br}{\underset{|}{C}}H-\underset{\displaystyle Br}{\underset{|}{C}}HCOC_6H_5+2NaSR \longrightarrow$$

$$C_6H_5CH{=}CHCOC_6H_5 + RSSR + 2NaBr$$

This process may be used also for converting a 2,3-dihaloalkane into a monoolefin. For example, 2,3-dibromo-2,3-dimethylbutane, and the alkali mercaptide, potassium ethyl sulfide, react as indicated by the following equation to form diethylsulfide, hexene, and sodium bromide:

$$H_3C-\overset{\displaystyle CH_3}{\overset{|}{\underset{\displaystyle Br}{\underset{|}{C}}}}-\overset{\displaystyle CH_3}{\overset{|}{\underset{\displaystyle Br}{\underset{|}{C}}}}-CH_3 + 2C_2H_5SNa \longrightarrow$$

$$H_3C-\overset{\displaystyle CH_3}{\overset{|}{C}}{=}\overset{\displaystyle CH_3}{\overset{|}{C}}-CH_3 + CH_3-CH_2-S-S-CH_2-CH_3+2NaBr$$

The process of this invention may be applied to a wide variety of organic compounds containing vicinal halogen atoms. The preferred halogens comprise the middle halogens, namely, chlorine, bromine, and iodine. Organic compounds containing two vicinal fluorine atoms are used less commonly in this process and compounds of astatine, the member of the halogen family with atomic number 85, are in general too rare for such use.

As herein set forth, the process converts alpha, beta-dihalo ketones into alpha, beta-unsaturated ketones and it also converts vicinal dihaloalkanes into monoolefins. Similarly, the process may be utilized for introducing unsaturation into cyloalkanes, alcohols, ethers, organic acids, esters, etc,. by reacting with an alkaline mercaptide a dihalogenated alcohol, ether, ester, carboxyl acid, and the like in which the halogen atoms are vicinal halogen atoms, i. e., in which each of two halogen atoms is bound to or combined with adjacent carbon atoms of the particular organic compound.

The alkaline mercaptides which are reacted with the dihalogenated compounds as herein set forth include ammonium mercaptides and also mercaptides of the alkali and alkaline earth metals, said mercaptides being soluble in water, in aliphatic alcohols, and in mixtures of said alcohols and water. The different alkaline mercaptides may be formed by reacting an appropriate base such as ammonium hydroxide, sodium hydroxide, potassium hydroxide, calcium hydroxide and the like with methyl mercaptan, ethyl mercaptan and other alkyl mercaptans in which the alkyl group contains more than two carbon atoms. For use in this process, it is generally preferred to use alkyl mercaptans in which the alkyl group contains from one to about four carbon atoms. The higher molecular weight mercaptans may also be used, particularly, when it is desirable to form the higher molecular weight dialkyl-disulfides such as diamyl-disulfide, dihexyl-disulfide, and the like.

The process of this invention is illustrated further by the following examples which are not to be misconstrued to limit the broad scope of the invention.

*Example I*

To a solution of sodium (2.5 g.) in methanol (100 cc.) and caustic methanol mercaptans (11.0 g. boiling at 65–75° C., chiefly propyl mercaptans) was added benzalacetophenone dibromide (18.5 g.). After boiling under reflux for 3 hours the mixture was poured into water, made strongly alkaline with 10% sodium hydroxide, and extracted with petroleum ether. The product was distilled in vacuo and the highest boiling product solidified. After recrystallization from methanol it was identified as benzalacetophenone by a mixed melting point. A liquid cut boiling lower was apparently a mixture of disulfides.

*Example II*

2,3-dibromo-2,3-dimethylbutane (66 g.) was added to a solution of potassium hydroxide (36 g. of 85%) and ethyl mercaptan (40 g.) in methanol (200 cc.). The mixture was boiled under reflux for 1 hour during which time the dibromide dissolved and potassium bromide precipitated. The whole mixture was poured into a large volume of water and extracted twice with isopentane. After drying over calcium chloride the extract was distilled at atmospheric pressure. A cut boiling at 71–80° C. was found to contain at least 90% of 2,3-dimethylbutene-2 by infrared examination (14 g. 61% of theory). A cut boiling at 147–150° C. was ethyl disulfide (23.6 g., 71% of theory).

The process of this invention may also be used to introduce a plurality of double bonds into an organic compound containing multiples of two vicinal halogen atoms per molecule. Thus 1,2,3,4-tetra-bromobutane or 1,2,3,4-tetra-chlorobutane may be converted into butadiene-1,3 by reaction with an alkaline mercaptide as potassium ethyl sulfide.

I claim as my invention:

1. A process which comprises reacting a mercaptide consisting of carbon, hydrogen, sulfur and a positive ion selected from the group consisting of ammonium, alkali metal and alkaline earth metal with an organic compound containing two adjacent carbon atoms in an aliphatic chain and a halogen atom combined with each of said two adjacent carbon atoms.

2. A process which comprises reacting a mercaptide consisting of carbon, hydrogen, sulfur and a positive ion selected from the group consisting of ammonium, alkali metal and alkaline earth metal with an aliphatic compound containing two adjacent carbon atoms and a halogen atom combined with each of said two adjacent carbon atoms.

3. A process which comprises reacting a mercaptide consisting of an alkali metal, carbon, hydrogen and sulfur with an organic compound containing two adjacent carbon atoms in an aliphatic chain and having a halogen combined with each of said two adjacent carbon atoms.

4. A process which comprises reacting a mercaptide consisting of an alkali metal, carbon, hydrogen and sulfur with an aliphatic compound containing two adjacent carbon atoms and having a halogen atom combined with each of said two adjacent carbon atoms.

5. A process for producing an organic compound containing a double bond and an alkyl disulfide which comprises reacting an alkali metal alkyl sulfide and an aliphatic compound containing two adjacent carbon atoms and having a halogen atom combined with each of said two adjacent carbon atoms.

6. A process for producing an organic compound containing a double bond and an alkyl disulfide which comprises reacting sodium alkyl sulfide and an aliphatic compound containing two adjacent carbon atoms and having a halogen atom combined with each of said two adjacent carbon atoms.

7. A process for producing an alpha, beta-unsaturated ketone and an alkyl disulfide which comprises reacting an alkali metal alkyl sulfide and an alpha, beta-dihaloketone.

8. A process for producing an olefin and an alkyl disulfide which comprises reacting an alkali metal alkyl sulfide and a dihaloalkane in which each of the halogen atoms is combined with adjacent carbon atoms.

9. A process for producing benzalacetophenone and dipropyldisulfide which comprises reacting alpha, beta-dibromobenzalacetophenone and sodium propyl sulfide.

10. A process for producing 2,3-dimethylbutene-2 and diethyldisulfide which comprises reacting 2,3-dibromo-2,3-dimethylbutane and an alkali metal ethyl sulfide.

11. A process for preparing butadiene-1,3 which comprises reacting a 1,2,3,4-tetrahalobutane and an alkali metal alkyl sulfide.

RALPH B. THOMPSON.

REFERENCES CITED

The following references are of record in the file of this patent:

UNITED STATES PATENTS

| Number | Name | Date |
|---|---|---|
| 2,097,155 | Groll et al. | Oct. 26, 1937 |
| 2,378,559 | Kamlet | June 19, 1945 |

OTHER REFERENCES

Tishchenko et al.: Chemical Abstracts, vol. 31, 8510–8511 (1937).

Tishchenko et al.: Chemical Abstracts, vol. 35, 3610–3611 (1941).

Sysoeva: Chemical Abstracts, vol. 37, 6643 (1943).